United States Patent
Li

(10) Patent No.: US 9,116,407 B2
(45) Date of Patent: Aug. 25, 2015

(54) ARRAY SUBSTRATE AND MANUFACTURING METHOD THEREOF AND DISPLAY DEVICE

(71) Applicant: BEIJING BOE OPTOELECTRONICS TECHNOLOGY, CO., LTD., Beijing (CN)

(72) Inventor: Cheng Li, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 318 days.

(21) Appl. No.: 13/806,172

(22) PCT Filed: Nov. 16, 2012

(86) PCT No.: PCT/CN2012/084772
§ 371 (c)(1),
(2) Date: Dec. 21, 2012

(87) PCT Pub. No.: WO2013/086919
PCT Pub. Date: Jun. 20, 2013

(65) Prior Publication Data
US 2014/0078433 A1    Mar. 20, 2014

(30) Foreign Application Priority Data

Dec. 12, 2011 (CN) .......................... 2011 1 0412978

(51) Int. Cl.
*G02F 1/1343* (2006.01)
*G02F 1/1368* (2006.01)
*H01L 23/535* (2006.01)

(52) U.S. Cl.
CPC ........ *G02F 1/1368* (2013.01); *G02F 1/134336* (2013.01); *H01L 23/535* (2013.01); *G02F 1/13439* (2013.01); *G02F 2201/40* (2013.01); *H01L 2924/0002* (2013.01)

(58) Field of Classification Search
USPC .................................................. 349/114, 141
See application file for complete search history.

(56) References Cited

U.S. PATENT DOCUMENTS 4,955,697 A * 9/1990 Tsukada et al. ................. 349/38
2002/0057391 A1 5/2002 Nakamura
(Continued)

FOREIGN PATENT DOCUMENTS

CN       1363854 A      8/2002
CN     102645804 A      8/2012
(Continued)

OTHER PUBLICATIONS

International Search Report mailed Feb. 28, 2013; PCT/CN2012/084772.
(Continued)

*Primary Examiner* — Lucy Chien
(74) *Attorney, Agent, or Firm* — Ladas & Parry LLP

(57) ABSTRACT

Embodiments of the present invention disclose an array substrate and a manufacturing method thereof and a display device. The array substrate comprises: gate scanning lines and data signal lines; pixel regions, defined by gate scanning lines and data signal lines; thin film transistors, each comprised in each of the pixel regions; pixel electrodes, each covering each of the pixel regions and comprising first and second pixel electrodes, wherein the pixel regions are divided into first and second pixel regions, the first and second pixel regions both are provided at intervals, and each of the first pixel regions is covered with a corresponding first pixel electrode, and the first and second pixel electrodes are respectively located in first and second layers, and each of the second pixel regions is covered with a corresponding second pixel electrode, and an insulating layer is provided between the first and second layers.

15 Claims, 3 Drawing Sheets

(56) References Cited

U.S. PATENT DOCUMENTS

2002/0140886 A1* 10/2002 Sugiura et al. ............... 349/113
2003/0038910 A1   2/2003 Nagano et al.

FOREIGN PATENT DOCUMENTS

| | | |
|---|---|---|
| JP | 2003-248233 A | 9/2003 |
| JP | 2005-250228 A | 9/2005 |

OTHER PUBLICATIONS

First Chinese Office Action dated Dec. 23, 2013; Appln. No. 201110412978.5.
International Preliminary Report on Patentability Issued Jun. 17, 2014; Appln. No. PCT/CN2012/084772.
Rejection Decision Issued Jun. 30, 2014; Appln. No. 201110412978.5.

* cited by examiner

_(1)_

ARRAY SUBSTRATE AND MANUFACTURING METHOD THEREOF AND DISPLAY DEVICE

FIELD OF THE INVENTION

Embodiments of the present invention relate to an array substrate and a manufacturing method thereof and a display device.

BACKGROUND OF THE INVENTION

Thin Firm Transistor Liquid Crystal Displays (TFT-LCDs) become dominant products because of their advantages of small volume, low power consumption, no radiation and high resolution.

A TFT-LCD is constituted mainly by assembling an array substrate and a color filter substrate, wherein a plurality of gate scanning lines and a plurality of data signal lines crossing one another are formed on the array substrate, and a plurality of pixel regions are defined by the plurality of gate scanning lines and the plurality of data signal lines and arranged in a matrix, each of the plurality of pixel regions covered with a pixel electrode. As shown in FIG. 1, the TFT-LCD array substrate comprises: a plurality of gate scanning lines 100 and a plurality of data signal lines 200, crossing one another; a plurality of pixel regions, defined by the plurality of gate scanning lines 100 and the plurality of data signal lines 200 and arranged in a matrix; and pixel electrodes 300, covering each of the plurality of pixel regions, wherein each of the plurality of pixel regions is defined by two adjacent gate scanning lines 100 and two adjacent data signal lines 200 crossing with each other.

Since the pixel electrode covering each of the pixel regions does not cover the corresponding gate scanning line and the corresponding data signal line, there is light leakage in the regions where the gate scanning line and the data signal line are located; thus, a black matrix (BM) is needed to be provided at corresponding positions on the color filter substrate, which therefore adversely affects the aperture ratio of TFT-LCD.

At present, the resolution of the LCD is continuously improved, with increased pixels per inch (PPI) and smaller pixel size. For a high-level pixel design, improvement of the aperture ratio is particularly important, but is also increasingly difficult.

In general, main factors affecting the aperture ration of the TFT-LCD comprise:

1. the resolution and display size of the LCD. Because the resolution and display size determine a pixel size, and on the basis of a current process, the larger the pixel size is, the higher the aperture ratio relatively is;

2. a electrode material, the resistivity of the gate scanning line and the data signal line is a focus of the attention; if the electrode material has a high resistivity, then, in order to reduce signal transmission delay, these lines have to be manufactured with a relatively larger width, which undoubtedly may reduce the aperture ratio of the pixel;

3. a design margin or a process margin: in order to obtain a stable yield, it is necessary to ensure the stable and reliable design; in addition, taking into account the process fluctuation, a certain margin will be kept, which also may affect the aperture ratio of the pixel.

For a specific TFT-LCD product, after the resolution and size are determined, the pixel size is also fixed. Moreover, although there are metallic materials with a relatively low resistivity among existing available electrode materials, due to a process, a line-width can not be manufactured to be relatively small. Therefore, reducing the design margin and the process margin becomes a major way to improve the aperture ratio.

For example, in some present TFT-LCD products, a pixel electrode is covered above the data signal line, thus a light leakage area is reduced; in addition, the data signal line can be utilized to block light, so that a width of the BM can be reduced, and thus the aperture ratio is improved.

However, a width of the data signal line is relatively narrow, typically about 4 microns; in order to prevent short circuit from occurring between adjacent pixel electrodes, in these TFT-LCD products, the pixel electrodes can covered only above a part of the data signal lines or a part of the regions above the data signal lines, that is, there still exist gap between adjacent pixel electrodes. Thus, many regions on the array substrate do not covered with the pixel electrodes, and therefore, a modulated electric field can not be formed in such regions, thus the light leakage still exists in the liquid crystal display, and the BM is still needed to be provided at corresponding positions on the color filter substrate. In this way, the aperture ratio of the TFT-LCD can only be improved limitedly; moreover, the risk of short circuit exists. Therefore, the stability and aperture ratio of the existing TFT-LCD are still needed to be further improved.

SUMMARY OF THE INVENTION

Embodiments of the invention provide an array substrate and a manufacturing method thereof and a display device, for improving the light transmission efficiency and stability of a display device.

An embodiment of the invention provides an array substrate, comprising: a plurality of gate scanning lines and a plurality of data signal lines, crossing one another; a plurality of pixel regions, defined by crossing of the plurality of gate scanning lines and the plurality of data signal lines and arranged in a matrix; a plurality of thin film transistors, each comprised in each of the plurality of pixel regions; a plurality of pixel electrodes, each covering each of the plurality of pixel regions, and comprising a plurality of first pixel electrodes and a plurality of second pixel electrodes, wherein the plurality of pixel regions are divided into a plurality of first pixel regions and a plurality of second pixel regions, each of the plurality of pixel regions is defined by crossing of two adjacent gate scanning lines and two adjacent data signal lines, the plurality of first pixel regions are provided at intervals, and each of the first pixel regions is covered with a corresponding first pixel electrode, and the first pixel electrodes are located in a first layer, the plurality of second pixel regions are provided at intervals, and each of the second pixel regions is covered with a corresponding second pixel electrode, and the second pixel electrodes are located in a second layer, and an insulating layer is provided between the first layer and the second layer, and wherein "being provided at intervals" refers to being provided at intervals of one pixel region.

Alternatively, the first pixel electrode and the second pixel electrode covering adjacent pixel regions along a direction of the gate scanning lines overlap above a corresponding data signal line.

Alternatively, at least one of the first pixel electrodes overlaps with a corresponding gate scanning line, and/or, at least one of the second pixel electrodes overlaps with a corresponding gate scanning line.

Alternatively, a resin layer is formed between the first layer and a layer where the plurality of data signal lines are located.

An embodiment of the invention also provides a method of manufacturing an array substrate, comprising: a pattern comprising a plurality of gate scanning lines and a plurality of data signal lines crossing one another is formed on a substrate, wherein a plurality of pixel regions arranged in a matrix are defined by crossing of the plurality of gate scanning lines and the plurality of data signal lines; moreover, each of the plurality of pixel regions is defined by crossing of two adjacent gate scanning lines and two adjacent data signal lines; the plurality of pixel regions are divided into a plurality of first pixel regions and a plurality of second pixel regions; on the substrate formed with the plurality of gate scanning lines and the plurality of data signal lines, a plurality of first pixel electrodes are formed, each of the plurality of first pixel electrodes corresponding to one of the first pixel regions, and the first pixel electrodes are provided at intervals; on the substrate formed with the plurality of gate scanning lines, the plurality of data signal lines and the plurality of first pixel electrodes, an insulating layer is formed; on the substrate formed with the plurality of gate scanning lines, the plurality of data signal lines, the plurality of first pixel electrodes and the insulating layer, a plurality of second pixel electrodes are formed, each of the plurality of second pixel electrodes corresponding to one of the second pixel regions, and the second pixel electrodes are provided at intervals in the pixel regions where no first pixel electrodes are provided; Wherein "being provided at intervals" refers to being provided at intervals of one pixel region.

Alternatively, the first pixel electrode and the second pixel electrode covering adjacent pixel regions along a direction of the gate scanning lines overlap above a corresponding data signal line.

Alternatively, at least one of the first pixel electrodes overlaps with a corresponding gate scanning line, and/or, at least one of the second pixel electrodes overlaps with a corresponding gate scanning line.

Alternatively, before a step that a plurality of first pixel electrodes are formed on the substrate formed with the plurality of gate scanning lines and the plurality of data signal lines, the method further comprising: on the substrate formed with the plurality of gate scanning lines and the plurality of data signal lines, a resin layer is deposited.

An embodiment of the invention further provides a display device, comprising an array substrate as described above.

In the embodiments of the present invention, the pixel electrodes covering non-adjacent pixel regions in the array substrate are located in the same layer, while the pixel electrodes covering adjacent pixel regions are located in different layers; thus, while the aperture ratio of the array substrate is improved by reducing the design margin and the process margin, the short circuit phenomenon will not occur between the pixel electrodes covering the adjacent pixel regions, improving the light transmission efficiency and stability of the display device.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In an embodiment of the present invention, on a TFT-LCD array substrate, there comprises: a plurality of gate scanning lines and a plurality of data signal lines crossing one another; a plurality of pixel regions, defined by crossing of the plurality of gate scanning lines and the plurality of data signal lines and arranged in a matrix; thin film transistors as switching elements, each comprised in each of the plurality of pixel regions; and pixel electrodes, each covering each of the plurality of pixel regions respectively, wherein pixel electrodes covering adjacent pixel regions are not located in the same layer, and a gate of the thin film transistor for each pixel region is electrically connected or integrally formed with the respective gate scanning line, a source thereof is electrically connected or integrally formed with the respective data signal line, and a drain thereof is electrically connected or integrally formed with the respective pixel electrode. Moreover, in the embodiment of the present invention, the pixel electrodes are formed by using two patterning processes, for example, at first, after the plurality of gate scanning lines and the plurality of data signal lines crossing one another are formed on a substrate, first pixel electrodes are formed correspondingly on each of non-adjacent first pixel regions on the substrate; then, after an insulating layer is deposited on the substrate formed with the first pixel electrodes thereon, second pixel electrodes are formed correspondingly on each of non-adjacent second pixel regions, wherein the second pixel region is different from the first pixel region. Thus, since the pixel electrodes covering the adjacent pixel regions are not located in the same layer, while the aperture ratio of the TFT-LCD is improved by reducing the design margin and the process margin, the short circuit phenomenon will not occur between the pixel electrodes covering the adjacent pixel regions.

For example, the pixel electrodes are formed of a transparent electrically conductive material, such as, indium tin oxide (ITO), indium zinc oxide (IZO), tin oxide ($SnO_x$), or the like.

Below, in connection with FIG. 2 and FIG. 3, a structure of an array substrate in accordance with an embodiment of the present invention will be described in detail.

Figure 1:
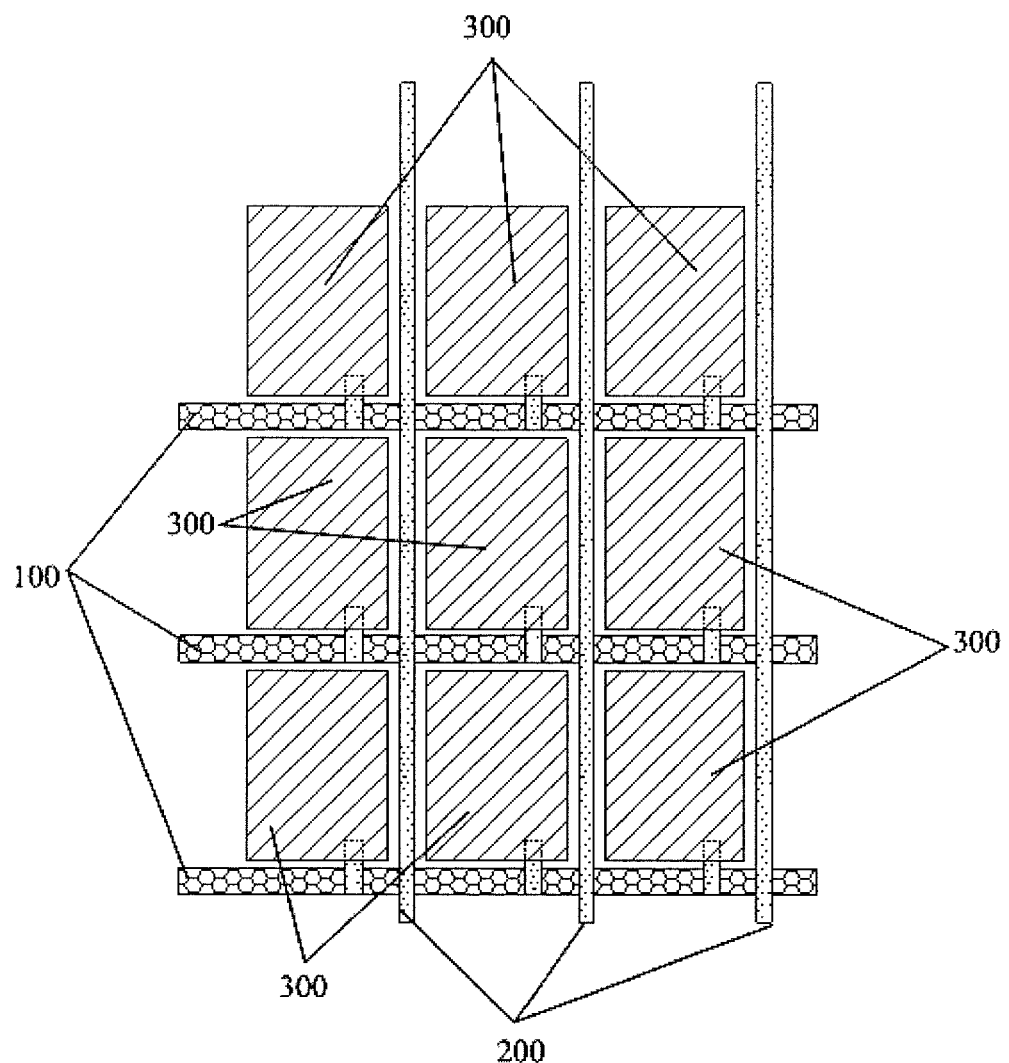
FIG. 1 is a schematic plan view of a TFT-LCD array substrate in the prior art.
Figure 2:
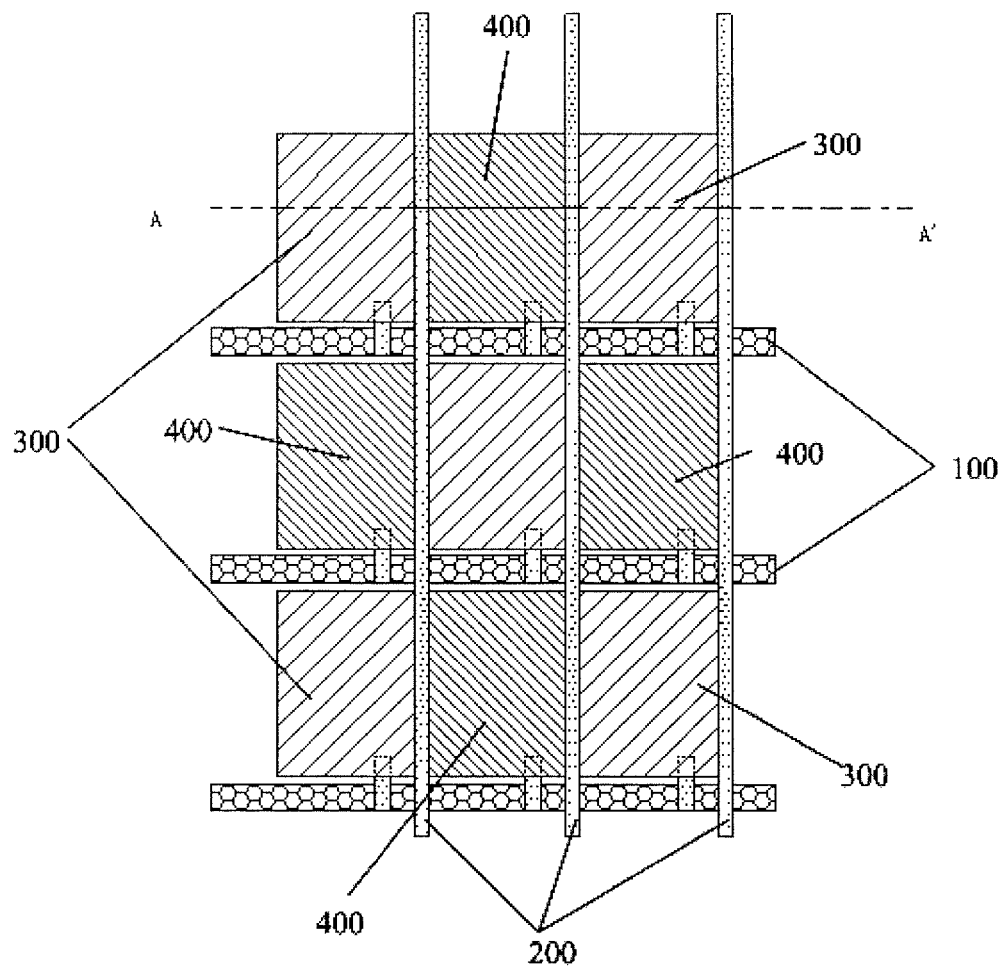
FIG. 2 is a schematic plan view of a TFT-LCD array substrate according to an embodiment of the present invention.

With reference to FIG. 2, in the embodiment of the invention, a TFT-LCD array substrate comprises: a plurality of the gate scanning lines 100 and a plurality of data signal lines 200, crossing one another; a plurality of pixel regions, defined by crossing of the plurality of gate scanning lines 100 and the plurality of data signal lines 200 and arranged in a matrix, wherein the plurality of pixel regions are divided into first pixel regions and second pixel regions; and, the first pixel regions and the second pixel regions are disposed alternately in a direction of the gate scanning lines and a direction of the data signal lines, each of the plurality of pixel regions is defined by crossing of two adjacent gate scanning lines 100 and two adjacent data signal lines 200.

Here, the first pixel regions are provided at intervals, and on each of the first pixel regions, there is covered with a corresponding first pixel electrode 300a, and the first pixel electrodes 300 are located in a first layer; the second pixel regions are provided at intervals, and on each of the second pixel regions, there is covered with a corresponding second pixel electrode 400, and the second pixel electrodes 400 are located in a second layer; moreover, an insulating layer is disposed between the first layer and the second layer. In the embodiment of the invention, "being provided at intervals" refers to "being provided at intervals of one pixel region". That is, the first pixel regions are not adjacent to each other; the second pixel regions are not adjacent to each other; thereby, the first pixel electrodes 300 are provided at intervals, and the second pixel electrodes 400 are provided at intervals as well.

Figure 3:
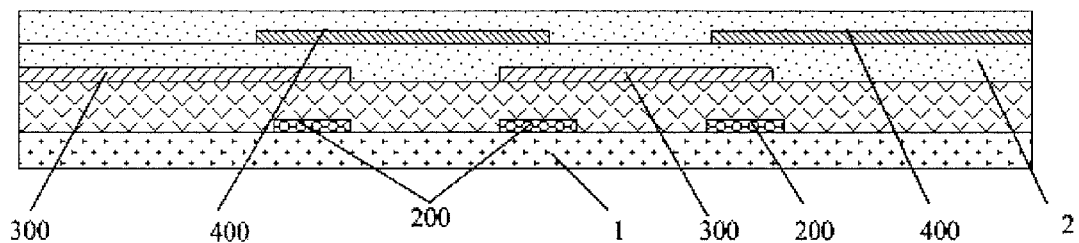
FIG. 3 is a schematic sectional view of the TFT-LCD array substrate in FIG. 2 according to an embodiment of the present invention, taken along the line A-A'.

An sectional view of the TFT-LCD array substrate taken along a line A-A" is shown in FIG. 3, in which the data signal lines 200 are located on the glass substrate 1, the first pixel electrodes 300 are located above the data signal lines 200, the insulating layer 2 is above the first pixel electrode 300, and the second pixel electrodes 400 are above the insulating layer 2.

Since the first pixel electrodes 300 are provided at intervals, and the second pixel electrodes 400 are also provided at intervals, meanwhile the first pixel electrodes 300 and the second pixel electrodes 400 are located in two layers, respectively. And, even if the first pixel electrodes 300 cover the gate scanning lines and/or the data signal lines formed in the first pixel regions where those first pixel electrodes are located, adjacent first pixel electrodes 300 are still far apart and can not be connected with each other. Thus, short circuit can not occur between the pixel electrodes covering adjacent pixel regions. In the embodiment of the invention, the design margin and the process margin can further be reduced to improve the aperture ratio.

Alternatively, the first pixel electrode 300 and the second pixel electrode 400 covering adjacent pixel regions in a direction of the gate scanning line overlap above the corresponding data signal line. Thus, the first pixel electrode 300 may cover part or whole of a region above the corresponding data signal line defining the first pixel region where the first pixel electrode is located, also the second pixel electrode 400 may cover part or whole of a region above the corresponding data signal line defining the second pixel region where the second pixel electrode is located. Here, as shown in FIG. 3, the first pixel electrode 300 covers part or whole of the region above the corresponding data signal line defining the first pixel region where that first pixel electrode is located; also, the second pixel electrode 400, covering an adjacent pixel region, covers part or whole of the region above the corresponding data signal line defining the second pixel region where that second pixel electrode is located.

Since the first pixel electrode 300 and the second pixel electrode 400 are located in the two layers respectively, no short circuit will occur between the pixel electrodes covering adjacent pixel regions. Further, along the direction of the gate scanning line, there are no gaps or gaps are reduced between the pixel electrodes covering adjacent pixel regions, so that regions which cause the light leakage are reduced, and thus the aperture ratio is improved.

Alternatively, it is also possible that the first pixel electrodes and the second pixel electrodes covering adjacent pixel regions along a direction of the data signal lines overlap above the corresponding gate scanning lines, and only gaps between the pixel electrodes along the direction of the data signal lines are reduced.

As an example, on the TFT-LCD array substrate, there may be one, two, several, or all of the first pixel electrodes 300 overlapping the corresponding gate scanning lines which defines the first pixel region(s) where the first pixel electrode(s) are located. That is, there may be one, two, several, or all of the first pixel electrodes 300 covering part or whole of the region(s) above the corresponding gate scanning lines.

Alternatively, there may be one, two, several, or all of the second pixel electrodes 400 overlapping the corresponding gate scanning lines. That is, there may be one, two, several, or all of the second pixel electrodes 400 covering part or whole of the region(s) above the corresponding gate scanning lines.

Alternatively, there may be one, two, several, or all of the first pixel electrodes 300 overlapping the corresponding gate scanning lines, and there may be one, two, several, or all of the second pixel electrodes 400 overlapping the corresponding gate scanning lines. That is, there may be one, two, several, or all of the first pixel electrodes 300 covering part or whole of the region(s) above the corresponding gate scanning lines, and there may be one, two, several, or all of the second pixel electrodes 400 covering part or whole of the region(s) above the corresponding gate scanning lines.

Thus, since there are no gaps or the gaps between the pixel electrodes along the direction of the data signal lines are reduced, so that the regions which cause the light leakage impact are reduced, and thus the aperture ratio is improved.

Alternatively, the first pixel electrode and the second pixel electrode covering adjacent pixel regions along the direction of the data signal line overlap above the corresponding gate scanning line, meanwhile, the first pixel electrode and the second pixel electrode covering adjacent pixel regions along the direction of the gate scanning line overlap above the corresponding data signal line; thus, not only the gaps between the pixel electrodes along the direction of the gate scanning lines can be reduced, but also the gaps between the pixel electrodes along the direction of the data signal lines can be reduced. Thus, there are no gaps or the gaps between the pixel electrodes covering adjacent the pixel regions along the direction of the gate scanning lines are reduced, meanwhile, there are no gaps or the gaps between the pixel electrodes covering the adjacent pixel regions along the direction of the data signal lines are reduced, so that the regions which cause the light leakage impact are reduced, and thus the aperture ratio is improved.

Figure 4:
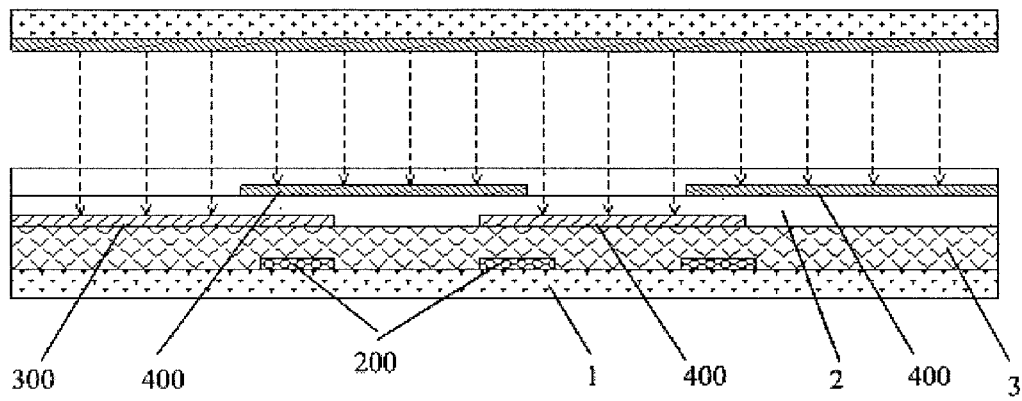
FIG. 4 is a schematic diagram of a modulated electric field after bonding two substrates according to an embodiment of the present invention.

In the TFT-LCD array substrate shown in FIG. 2; there are no gaps between the pixel electrodes along the direction of the gate scanning lines; after the array substrate is bonded to an color filter substrate to form the TFT-LCD, since the first pixel electrode 300 and the second pixel electrode 400 covering adjacent pixel regions along the direction of the gate scanning line overlap above the corresponding data signal line, there is a modulated electric field, which is generated by the pixel electrode and a common electrode on the color filter substrate, in any position within a liquid crystal cell, that is, a complete modulated electric field is formed in the liquid crystal cell, as shown in FIG. 4. Thus, there is no possibility of light leakage in the liquid crystal cell, so that the alignment margin of bonding the two substrates can not be considered, and a line-width of the BM on the color filter substrate can be designed as being minimum, so as to improve the aperture ratio of the pixel and improve the performance of the TFT-LCD.

Further, in the embodiment shown in FIG. 4, if the precision of the bonding process is high enough, then the gate scanning lines and the data signal lines can be used as a light-blocking layer, so that the BM on the color filter substrate can be eliminated.

Alternatively, because parasitic capacitance exists between the pixel electrode and the data signal line, when the parasitic capacitance is too large, it may cause very serious crosstalk in the liquid crystal display, therefore, in the embodiment of the invention, between the first layer where the first pixel electrodes 300 are located and the layer where the data signal lines are located, there further comprises: a resin layer. Thus, since the resin material itself has a relatively low dielectric constant and a relatively large thickness, which can effectively reduce the parasitic capacitance between the pixel electrode and the data signal line, thereby improving the image characteristics, so as to improve the performance of the TFT-LCD.

Here, as shown in FIG. 4, between the first layer where the first pixel electrodes 300 are located and the layer where the data signal lines 200 are located, there comprises a resin layer 3.

In the embodiment of the invention, the pixel electrodes above adjacent pixel regions on the TFT-LCD array substrate are not located in the same layer, that is, the pixel electrodes are formed through two patterning processes. In each of the patterning processes, there comprises masking, exposing, developing, etching, stripping and other processes.

Below, a method of manufacturing an array substrate according to an embodiment of the invention will be described in detail.

As an example, a process of manufacturing a TFT-LCD array substrate comprises:

Step 501: on a substrate, a pattern comprising a plurality of gate scanning lines and a plurality of data signal lines crossing one another is formed, wherein, one pixel region is defined by crossing of two adjacent gate scanning lines and two adjacent data signal lines.

Through two or more patterning processes, the plurality of gate scan lines and the plurality of data signal lines crossing one another are formed on the substrate. Thus, a plurality of pixel regions arranged in a matrix are defined by the plurality of gate scanning lines and the plurality of data signal lines, that is, one pixel region is defined by crossing of two adjacent gate scanning lines and two adjacent data signal lines, wherein the plurality of pixel regions are divided into first pixel regions and second pixel regions, and the first pixel regions and the second pixel regions are provided alternately in a direction of the gate scanning lines and a direction of the data signal lines. The first pixel regions are provided at intervals, and the second pixel regions are also provided at intervals, so that the first pixel regions are not adjacent to each other, and the second pixel region are not adjacent to each other; the first pixel region is different from the second pixel region.

Step 502: on the substrate formed with the plurality of gate scanning lines and the plurality of data signal lines, first pixel electrodes corresponding to the first pixel regions are formed.

On the substrate formed with the plurality of gate scanning lines and the plurality of data signal lines, the first pixel electrodes are formed corresponding to each of non-adjacent first pixel regions through one patterning process. That is, a plurality of first pixel electrodes are formed, and each of the first pixel electrodes corresponds to one pixel region, and the first pixel electrodes are provided at intervals. Here, the pixel regions to which the first pixel electrodes correspond are the first pixel regions, and "being provided at intervals" refers to "being provided at intervals of one pixel region". However, if the first pixel electrodes extend so as to cover the gate scanning lines and/or the data signal lines that define the pixel regions where the first gate electrodes are located, then the intervals between adjacent first pixel regions may be smaller than one pixel region.

At least one of the first pixel electrodes may cover part or whole of region above the data signal lines, or, at least one of the first pixel electrodes may cover part or whole of region above the gate scanning lines; alternatively, at least one of the first pixel electrodes may cover part or whole of the region above the data signal lines, and, at least one of the first pixel electrodes may cover part or whole of the region above the gate scanning lines.

Step 503: an insulating layer is formed by depositing the insulating layer on the substrate formed with the first pixel electrodes.

The insulating layer is used to isolate the first pixel electrodes and second pixel electrodes; in general, the insulating layer comprises a silicon nitride.

Step 504: on the substrate formed with the insulating layer, the plurality of second pixel electrodes are formed, each corresponding to one of the second pixel regions; the second pixel electrodes are provided at intervals and provided in the pixel regions where no first pixel electrodes are provided. Here, the pixel regions to which the second pixel electrodes correspond are the second pixel regions, and the second pixel regions are provided at intervals. That is, the corresponding second pixel electrode may be formed on each of non-adjacent second pixel regions in the matrix, wherein the second pixel region is different from the first pixel region.

On the substrate formed with the plurality of gate scanning lines, the plurality of data signal lines, the first pixel electrodes and the insulating layer, through a patterning process, the second pixel electrodes are formed corresponding to each of the second pixel regions. Since the second pixel region is different from the first pixel region, pixel electrodes covering adjacent pixel regions are not located in the same layer.

Here, at least one of the second pixel electrodes may cover part or whole of the region above the corresponding data signal line, or, at least one of the second pixel electrodes may cover part or whole of the region above the corresponding gate scanning line; alternatively, at least one of the second pixel electrodes may cover part or whole of the region above the corresponding data signal line, and, at least one of the second pixel electrodes may cover part or whole of the region above the corresponding gate scanning line.

Accordingly, in the embodiment of the invention, the first pixel electrode and the second pixel electrode covering adjacent pixel regions along the direction of the gate scanning lines may overlap above a corresponding data signal line.

Alternatively, at least one of the first pixel electrodes overlaps with the corresponding gate scanning line; or, at least one of the second pixel electrodes overlaps with the corresponding gate scanning line.

Alternatively, at least one of the first pixel electrodes overlaps with the corresponding gate scanning line, and, at least one of the second pixel electrodes overlaps with the corresponding gate scanning line.

Through the above described processes, the TFT-LCD array substrate can be manufactured, in which the pixel electrodes covering adjacent pixel regions are not located in the same layer. Certainly, in order to effectively reduce a parasitic capacitance between the pixel electrode and the data line, in the embodiment of the invention, before step 502, the method further comprises: depositing a resin layer on the substrate formed with a pattern comprising the gate scanning lines and the data signal lines.

In all above described embodiments, description is given with a TFT-LCD array substrate as an example, but the embodiments of the present invention are not limited thereto; a electronic paper, an OLED panel, a digital photo frame, a mobile phone, a tablet computer, or any of other products or components with a display function can also adopt the above described array substrate.

The embodiment of the invention further provides a display device, comprising any of the above described array substrates.

One example of the display device is a liquid crystal display device, wherein a TFT array substrate and an opposite substrate are disposed to face each other to faun a liquid crystal cell, and a liquid crystal material is filled in the liquid crystal cell. The opposite substrate is a color filter substrate, for example. A pixel electrode of each pixel unit of the TFT array substrate is used to apply an electric field, so as to control a rotation of the liquid crystal material and to perform a displaying operation. In some examples, the liquid crystal display device further comprises a backlight source provided for the array substrate.

Another example of the display device is an organic light emitting display (OLED) device, wherein a pixel electrode of each pixel unit of the TFT array substrate is used as an anode or a cathode to drive an organic light-emitting material to emit light so as to perform a displaying operation.

The display device may be a LCD panel, an electronic paper, an OLED panel, a LCD TV, a LCD, a digital photo frame, a mobile phone, a tablet computer or any of other products or components with a display function.

In the display device according to the embodiment of the present invention, the pixel electrodes covering non-adjacent pixel regions in the array substrate are located in the same layer, while the pixel electrodes covering adjacent pixel regions are located in different layers; thus, while the aperture ratio of the TFT-LCD is improved by reducing the design margin and the process margin, the short circuit phenomenon will not occur between the pixel electrodes covering the adjacent pixel regions, improving the light transmission efficiency and stability of the display device.

Further, the pixel electrodes covering adjacent pixel regions along the direction of the gate scanning lines overlap above the corresponding data signal lines, thus a complete modulated electric field can be formed within a liquid crystal cell, so that there is no possibility of light leakage in the liquid crystal cell, and a line-width of the BM on the color filter substrate can be designed as being minimum, so as to improve the aperture ratio of the pixel and improve the light transmission efficiency of the display device.

Alternatively, the gaps between the pixel electrodes along the direction of the data signal lines also can be reduced or eliminated, so that the regions which cause the light leakage impact are reduced; thus, the aperture ratio is further improved, and the light transmission efficiency of the display device is improved.

Alternatively, not only the gaps between the pixel electrodes along the direction of the gate scanning lines can be reduced, but also the gaps between the pixel electrodes along the direction of the data signal lines can be reduced. Thus, the gaps between the pixel electrodes covering adjacent pixel regions along the direction of the gate scanning lines are reduced or eliminated, meanwhile, the gaps between the pixel electrodes along the direction of the data signal lines are reduced or eliminated, so that the regions which cause the light leakage impact are reduced, and thus the aperture ratio is improved.

It should be understood by those skilled in the art that various changes and modifications may be made in these embodiments without departing from the scope and spirit of the present invention. If these changes and modifications fall into the range of the claims and their equivalents, the present invention also is directed to include these changes and modifications.

What is claimed is:

1. An array substrate, comprising:
  a plurality of gate scanning lines and a plurality of data signal lines, crossing one another;
  a plurality of pixel regions, defined by crossing of the plurality of gate scanning lines and the plurality of data signal lines and arranged in a matrix;
  a plurality of thin film transistors, each comprised in each of the plurality of pixel regions;
  a plurality of pixel electrodes, each covering each of the plurality of pixel regions, and comprising a plurality of first pixel electrodes and a plurality of second pixel electrodes,
  wherein the plurality of pixel regions are divided into a plurality of first pixel regions and a plurality of second pixel regions,
  each of the plurality of pixel regions is defined by crossing of two adjacent gate scanning lines and two adjacent data signal lines,
  the plurality of first pixel regions are provided at intervals, and each of the first pixel regions is covered with a corresponding first pixel electrode, and the first pixel electrodes are located in a first layer,
  the plurality of second pixel regions are provided at intervals, and each of the second pixel regions is covered with a corresponding second pixel electrode, and the second pixel electrodes are located in a second layer, and
  an insulating layer is provided between the first layer and the second layer, and
  wherein "being provided at intervals" refers to being provided at intervals of one pixel region, wherein there is one second pixel region between any two adjacent first pixel regions of the plurality of first pixel regions, and there is one first pixel region between any two adjacent second pixel regions of the plurality of first pixel regions.

2. The array substrate according to claim 1, wherein the first pixel electrode and the second pixel electrode covering adjacent pixel regions along a direction of the gate scanning lines overlap above a corresponding data signal line.

3. The array substrate according to claim 1, wherein the first pixel electrode and the second pixel electrode covering adjacent pixel regions along a direction of the data signal lines overlap above a corresponding gate scanning line 4. The array substrate according to claim 1, wherein the first pixel electrode and the second pixel electrode covering adjacent pixel regions along a direction of the gate scanning lines overlap above a corresponding data signal line; moreover, the first pixel electrode and the second pixel electrode covering adjacent pixel regions along a direction of the data signal lines overlap above a corresponding gate scanning line.

5. The array substrate according to claim 1, wherein at least one of the first pixel electrodes overlaps with a corresponding gate scanning line, and/or, at least one of the second pixel electrodes overlaps with a corresponding gate scanning line.

6. The array substrate according to claim 2, wherein at least one of the first pixel electrodes overlaps with a corresponding gate scanning line, and/or, at least one of the second pixel electrodes overlaps with a corresponding gate scanning line.

7. The array substrate according to claim 1, wherein a resin layer is formed between the first layer and a layer where the plurality of data signal lines are located.

8. A method of manufacturing an array substrate, comprising:
- a pattern comprising a plurality of gate scanning lines and a plurality of data signal lines crossing one another is formed on a substrate, wherein a plurality of pixel regions arranged in a matrix are defined by crossing of the plurality of gate scanning lines and the plurality of data signal lines; moreover, each of the plurality of pixel regions is defined by crossing of two adjacent gate scanning lines and two adjacent data signal lines; the plurality of pixel regions are divided into a plurality of first pixel regions and a plurality of second pixel regions;
- on the substrate formed with the plurality of gate scanning lines and the plurality of data signal lines, a plurality of first pixel electrodes are formed, each of the plurality of first pixel electrodes corresponding to one of the first pixel regions, and the first pixel electrodes are provided at intervals;
- on the substrate formed with the plurality of gate scanning lines, the plurality of data signal lines and the plurality of first pixel electrodes, an insulating layer is formed;
- on the substrate formed with the plurality of gate scanning lines, the plurality of data signal lines, the plurality of first pixel electrodes and the insulating layer, a plurality of second pixel electrodes are formed, each of the plurality of second pixel electrodes corresponding to one of the second pixel regions, and the second pixel electrodes are provided at intervals in the pixel regions where no first pixel electrodes are provided;
- wherein "being provided at intervals" refers to being provided at intervals of one pixel region, wherein there is one second pixel region between any two adjacent first pixel regions of the plurality of first pixel regions, and there is one first pixel region between any two adjacent second pixel regions of the plurality of first pixel regions.

9. The method according to claim 8, wherein the first pixel electrode and the second pixel electrode covering adjacent pixel regions along a direction of the gate scanning lines overlap above a corresponding data signal line.

10. The method according to claim 8, wherein the first pixel electrode and the second pixel electrode covering adjacent pixel regions along a direction of the data signal lines overlap above a corresponding gate scanning line.

11. The method according to claim 8, wherein the first pixel electrode and the second pixel electrode covering adjacent pixel regions along a direction of the gate scanning lines overlap above a corresponding data signal line; moreover, the first pixel electrode and the second pixel electrode covering adjacent pixel regions along a direction of the data signal lines overlap above a corresponding gate scanning line.

12. The method according to claim 8, wherein at least one of the first pixel electrodes overlaps with a corresponding gate scanning line, and/or, at least one of the second pixel electrodes overlaps with a corresponding gate scanning line.

13. The method according to claim 9, wherein at least one of the first pixel electrodes overlaps with a corresponding gate scanning line, and/or, at least one of the second pixel electrodes overlaps with a corresponding gate scanning line.

14. The method according to claim 8, wherein before a step that a plurality of first pixel electrodes are formed on the substrate formed with the plurality of gate scanning lines and the plurality of data signal lines, the method further comprising:
- on the substrate formed with the plurality of gate scanning lines and the plurality of data signal lines, a resin layer is deposited.

15. A display device, comprising:
an array substrate in accordance with claim 1;
an opposite substrate, disposed opposite to the array substrate to form a liquid crystal cell; and
liquid crystal material filled in the liquid crystal cell.

* * * * *